(12) United States Patent
Takahashi

(10) Patent No.: US 8,581,226 B2
(45) Date of Patent: Nov. 12, 2013

(54) NONVOLATILE MEMORY DEVICE

(75) Inventor: Kensuke Takahashi, Kanagawa-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/236,729

(22) Filed: Sep. 20, 2011

(65) Prior Publication Data

US 2012/0241707 A1   Sep. 27, 2012

(30) Foreign Application Priority Data

Mar. 24, 2011   (JP) ................... 2011-066313

(51) Int. Cl.
| H01L 29/06 | (2006.01) |
| H01L 27/108 | (2006.01) |
| G11C 27/00 | (2006.01) |
| G11C 11/00 | (2006.01) |

(52) U.S. Cl.
USPC ............... 257/5; 365/46; 365/148; 257/296

(58) Field of Classification Search
None
See application file for complete search history.

(56) References Cited

U.S. PATENT DOCUMENTS

| 7,463,509 | B2* | 12/2008 | Kim et al. .............. 365/158 |
| 7,995,374 | B2* | 8/2011 | Komura et al. ............. 365/148 |
| 8,450,709 | B2* | 5/2013 | Kusai et al. ................ 257/2 |
| 2010/0054014 | A1* | 3/2010 | Lee et al. .................. 365/148 |
| 2010/0213433 | A1* | 8/2010 | Yamamoto et al. ............ 257/4 |
| 2010/0238702 | A1* | 9/2010 | Yamaguchi et al. .......... 365/148 |
| 2011/0068314 | A1 | 3/2011 | Takahashi et al. |
| 2011/0140065 | A1* | 6/2011 | Maesaka et al. ............... 257/2 |
| 2012/0211719 | A1* | 8/2012 | Haimoto et al. ............... 257/4 |

FOREIGN PATENT DOCUMENTS

| JP | 2007-288008 | 11/2007 |
| JP | 2008-192995 | 8/2008 |
| JP | 2010-135527 | 6/2010 |
| JP | 2010-534941 | 11/2010 |
| WO | WO 2009/135072 A2 | 11/2009 |

OTHER PUBLICATIONS

U.S. Appl. No. 13/052,179, filed Mar. 21, 2011, Takashi Shigeoka, et al.
U.S. Appl. No. 13/051,650, filed Mar. 18, 2011, Takashi Shigeoka, et al.
Office Action issued Jun. 11, 2013 in Japanese Application No. 2011-066313 (With English Translation).

* cited by examiner

Primary Examiner — Jenny L Wagner
Assistant Examiner — Priya Rampersaud
(74) Attorney, Agent, or Firm — Oblon, Spivak, McClelland, Maier & Neustadt, L.L.P.

(57) ABSTRACT

According to one embodiment, a nonvolatile memory device includes a word line interconnect layer, a bit line interconnect layer, and a pillar. The word line interconnect layer includes a plurality of word lines extending in a first direction. The bit line interconnect layer includes a plurality of bit lines extending in a second direction. The pillar is disposed between each of the word lines and each of the bit lines. The pillar includes a current selection film and a plurality of variable resistance films stacked on the current selection film. One variable resistance film includes a metal and either oxygen or nitrogen. Remainder of the variable resistance films include the metal, either oxygen or nitrogen, and a highly electronegative substance having electronegativity higher than electronegativity of the metal. A concentration of highly electronegative substance in the remainder of the variable resistance films is different among the variable resistance films.

9 Claims, 11 Drawing Sheets

NONVOLATILE MEMORY DEVICE

CROSS-REFERENCE TO RELATED APPLICATIONS

This application is based upon and claims the benefit of priority from the prior Japanese Patent Application No. 2011-066313, filed on Mar. 24, 2011; the entire contents of which are incorporated herein by reference.

FIELD

Embodiments described herein relate generally to a nonvolatile memory device.

BACKGROUND

The nonvolatile memory that has become the mainstream on today's market, as typified by flash memory and SONOS memory, is realized by technology in which electrical charge is accumulated on an insulating film disposed above a channel, and the threshold voltage of a semiconductor transistor is varied. In this type of charge accumulation type of nonvolatile memory, miniaturization of the transistors is essential in order to achieve large capacity, but as the film of the insulating film that retains the charge becomes thinner, leakage currents increase, so the charge retention capability is reduced. Therefore it is difficult to achieve large capacity with the charge accumulation transistor type of nonvolatile memory.

Therefore attention has been focused on variable resistance elements that can be switched between not less than two values of electrical resistance level by some kind of electrical stimulation, as a nonvolatile memory element. The reason for this is that for normal variable resistance elements, in most cases differences in electrical resistance can be detected even when miniaturized, so it is considered that if there are materials and a principle for varying the resistance value, then they can be advantageously miniaturized. In contrast, in the type that accumulates electrical charge on a capacitance, such as a DRAM for example, the signal voltage becomes lower as the quantity of charge accumulated is reduced due to miniaturization, so it becomes difficult to detect the signal.

Several technologies have already been proposed as technologies for varying the electrical resistance value. For example, when a voltage or current is applied to a structural body having a structure in which a metal oxide is sandwiched between electrodes (metal/metal oxide/metal), it is known that the resistance value of the metal oxide varies. Normally a memory device that uses this property is referred to as a Resistance Random Access Memory (ReRAM). A 3-dimensional cross-point structure has been proposed for an actual variable resistance memory device structure, in which memory cells are disposed at the intersection points of word lines (WL) and bit lines (BL), from the point of view of large scale integration.

However, further large scale integration of 3-dimensional cross-point structure memory devices is becoming difficult. This is because as plane structures are miniaturized, the amount of investment in photolithography machines significantly increases for devices in the 20 nm generation and beyond. Also, as the number of stacked layers increases, the number of processes increases accordingly. As a result the increase in manufacturing cost due to multiple layering is greater than the effect of the reduction in the wafer cost per bit due to multiple layering, so on the contrary the cost per bit increases. Also, as a result of the increase in the number of stacked layers, contacts extending in the vertical direction become longer, so wiring delays become significant, and the operating margin of the memory cells becomes smaller.

DETAILED DESCRIPTION

In general, according to one embodiment, a nonvolatile memory device includes a word line interconnect layer, a bit line interconnect layer, and a pillar. The word line interconnect layer includes a plurality of word lines extending in a first direction. The bit line interconnect layer includes a plurality of bit lines extending in a second direction that intersects the first direction. The pillar is disposed between each of the word lines and each of the bit lines. The pillar includes a current selection film and a plurality of variable resistance films stacked on the current selection film. One of the variable resistance films includes a metal and either oxygen or nitrogen. Remainder of the variable resistance films include the metal, either oxygen or nitrogen, and a highly electronegative substance having an electronegativity higher than an electronegativity of the metal. A concentration of highly electronegative substance in the remainder of the variable resistance films is different among the variable resistance films.

Various embodiments will be described hereinafter with reference to the accompanying drawings.

Figure 1:
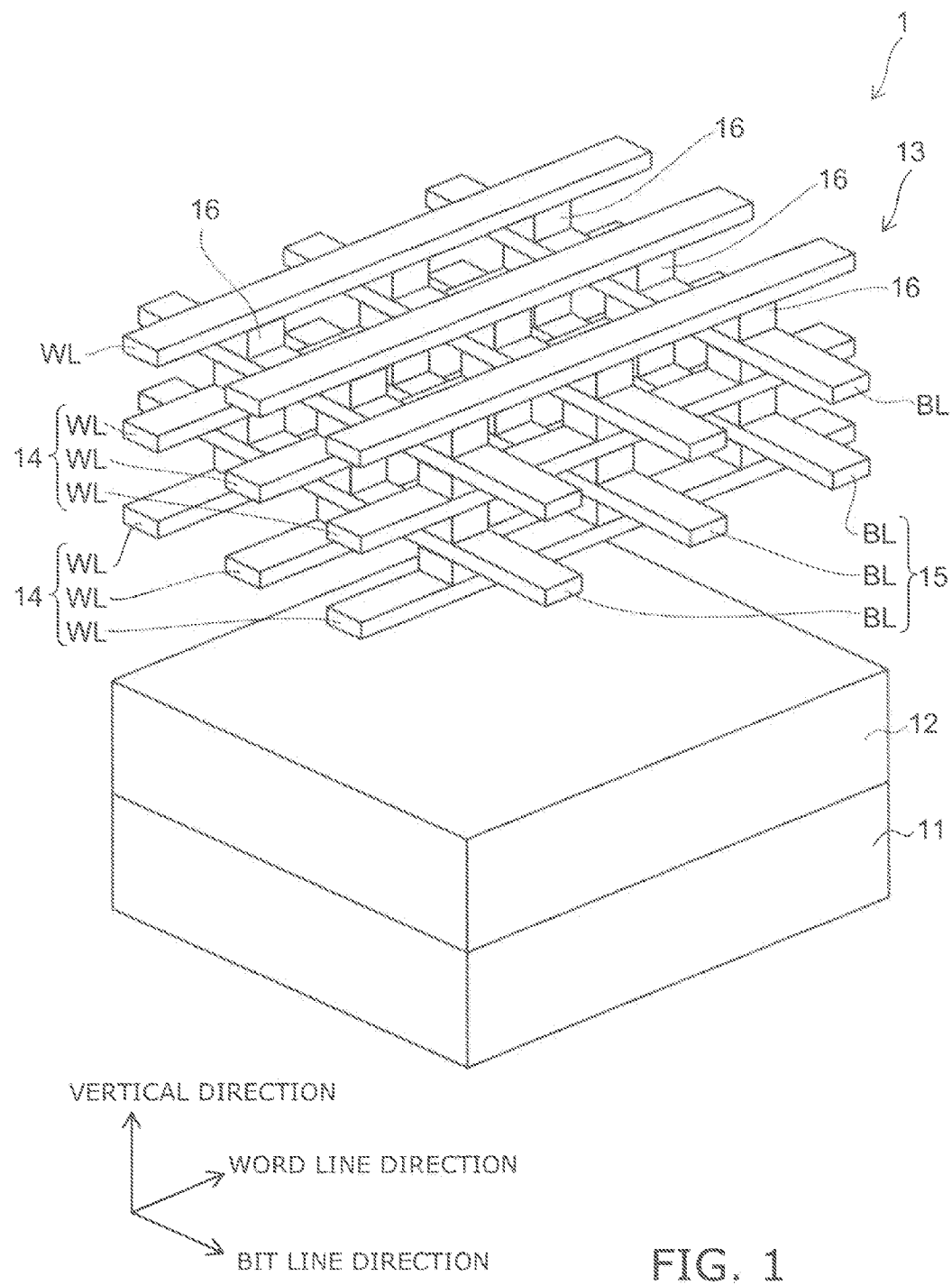
FIG. 1 is a perspective view illustrating a nonvolatile memory device according to an embodiment.
Figure 2:
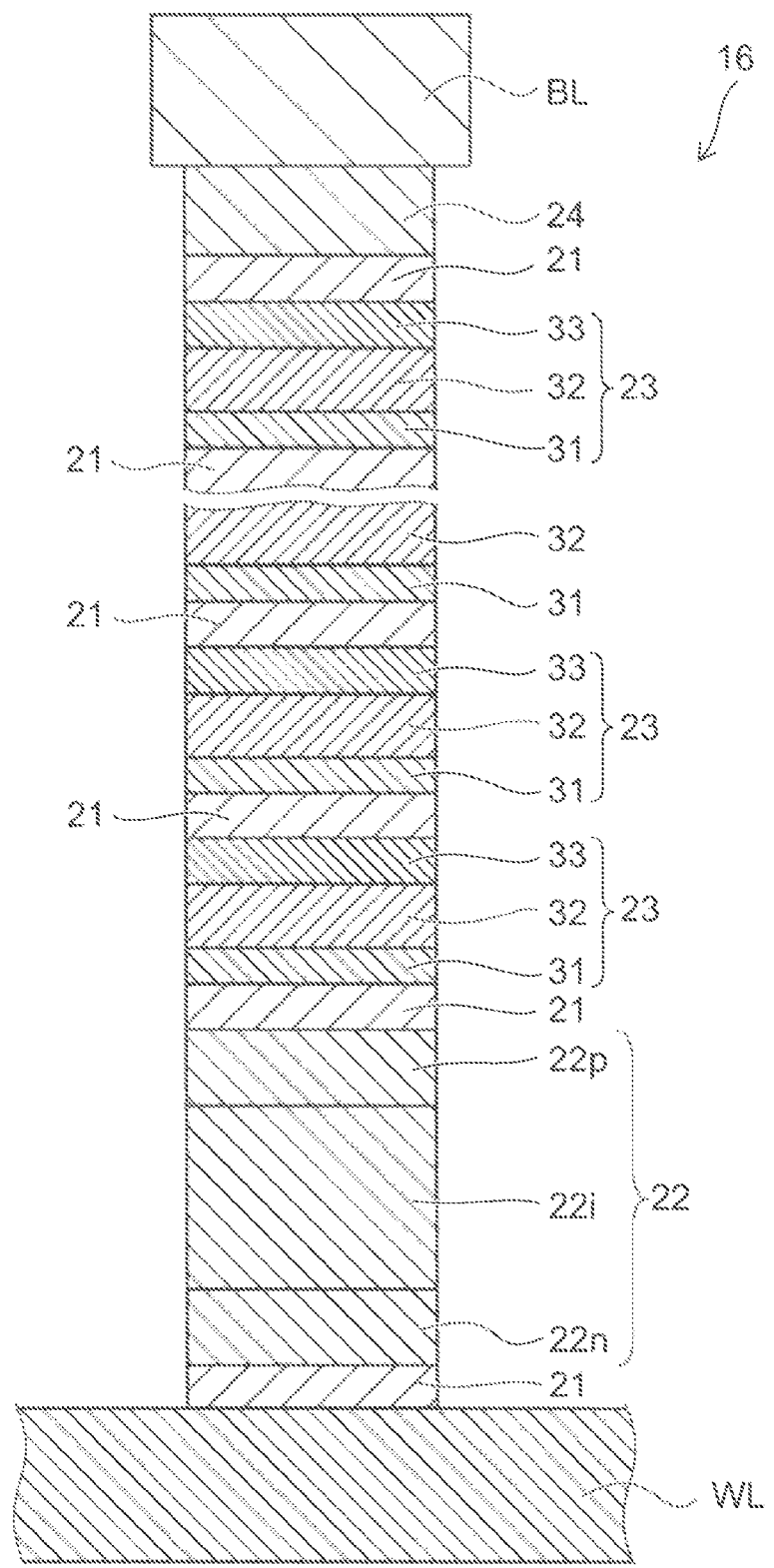
FIG. 2 is a cross-sectional view illustrating a pillar in the nonvolatile memory device according to the embodiment.

FIG. 1 is a perspective view illustrating a nonvolatile memory device according to the embodiment, and FIG. 2 is a cross-sectional view illustrating a pillar in the nonvolatile memory device according to the embodiment.

The nonvolatile memory device according to the embodiment is a ReRAM.

As illustrated in FIG. 1, in a nonvolatile memory device 1 according to the embodiment, a silicon substrate 11 is provided, and a drive circuit (not illustrated on the drawing) of the nonvolatile memory device 1 is formed on a top layer portion and a top face of the silicon substrate 11. An inter-layer insulating film 12 formed from silicon oxide, for example, is provided on the silicon substrate 11 encapsulating the drive circuit, and a memory cell unit 13 is provided on the inter-layer insulating film 12. In FIG. 1, a lower part of the inter-layer insulating film 12 is indicated, but actually the inter-layer insulating film 12 covers word lines WL and bit lines BL.

In the memory cell unit 13, word line interconnect layers 14 including a plurality of word lines WL extending in a direction parallel to the top face of the silicon substrate 11 (hereafter referred to as a "word line direction") and bit line interconnect layers 15 including a plurality of bit lines BL extending in a direction parallel to the top face of the silicon substrate 11 and that intersect the word line direction at, for example, right angles (hereafter referred to as a "bit line direction") are stacked alternately, with the inter-layer insulating film 12 disposed therebetween. The word lines WL and the bit lines BL may, for example, be formed from tungsten (W). Also, there is no contact between word lines WL, between bit lines BL, or between word lines WL and bit lines BL.

Also, pillars 16 extending in the direction normal to the top face of the silicon substrate 11 (hereafter referred to as the "vertical direction") are provided at the points of closest proximity between each word line WL and each bit line BL. The pillars 16 are formed between word lines WL and bit lines BL. A single memory cell is constituted from a single pillar 16. In other words, a nonvolatile memory device 1 is a cross-point type device in which memory cells are disposed at each of the nearest neighbor of the word lines WL and the bit lines BL.

Hereinafter, a configuration of the pillar 16 will be explained with reference to FIG. 2.

As illustrated in FIG. 2, there are two types of pillar 16: a pillar 16 in which the word line WL is disposed below the pillar and the bit line BL is disposed above the pillar, and a pillar 16 in which the word line WL is disposed above the pillar and the bit line BL is disposed below the pillar. In the following, an example is given for a pillar 16 below which the word line WL is disposed.

In the pillar 16, from the lower layer side, in other words from the word line WL side, a barrier metal layer 21 and a current selection film 22 are provided in that order, and a plurality of variable resistance units 23 are stacked thereupon. The barrier metal layer 21 is provided above and below the plurality of variable resistance units 23, and between variable resistance units 23. A contact layer 24 that is in contact with the bit line BL is provided above the uppermost barrier metal layer 21. In each variable resistance unit 23, a cathode film 31, a variable resistance film 32, and an anode film 33 are stacked in that order from the lower layer side, and contacting each other.

The current selection film 22 is a film that selects whether or not a current will be supplied. For example, in the pillar 16, when the potential of the bit line is higher than the potential of the word line WL, current is allowed to flow. In this case, the current selection film 22 is a diode with the anode on the bit line BL side, and the cathode on the word line WL side. For example, the current selection film 22 is a pin-type silicon diode, with an n-type layer 22*n*, an i-type layer (intrinsic semiconductor layer) 22*i*, and a p-type layer 22*p* stacked in that order from the word line WL side. Also, in each variable resistance unit 23, the cathode film 31 is disposed on the word line WL side of the variable resistance film 32, and the anode film 33 is disposed on the bit line BL side of the variable resistance film 32.

Therefore, in the current selection film 22 in the pillar 16 with the word line WL disposed below and the bit line BL disposed above, the n-type layer 22*n* is disposed on the lower layer side, and the p-type layer 22*p* is disposed on the upper layer side. Also, in each variable resistance unit 23, the cathode film 31 is disposed on the lower layer side, and the anode film 33 is disposed on the upper layer side. On the other hand, in the current selection film 22 in the pillar 16 with the bit line BL disposed below and the word line WL disposed above, the p-type layer 22*p* is disposed on the lower layer side, and the n-type layer 22*n* is disposed on the upper layer side. Also, in each variable resistance unit 23, the anode film 33 is disposed on the lower layer side, and the cathode film 31 is disposed on the upper layer side.

The variable resistance film 32 is a film having two levels of resistance state, a "low resistance state" and a "high resistance state", and is formed from a metal oxide. The variable resistance film 32 includes, for example, one or more metals selected from the group consisting of hafnium (Hf), nickel (Ni), titanium (Ti), zirconium (Zr), iron (Fe), vanadium (V), manganese (Mn), cobalt (Co), and aluminum (Al), and oxygen (O) or nitrogen (N). In other words, the main component of the variable resistance film 32 is an oxide or nitride of the above metals. Preferably the main component of the variable resistance film 32 is, for example, hafnium oxide ($HfO_x$). The variable resistance film 32 may include both oxygen and nitrogen.

Also, if N is the number of variable resistance units 23 provided in one pillar 16 (where N is an integer that is not less than 2), then all the (N) variable resistance films 32, or the remaining (N−1) variable resistance film 32 apart from one variable resistance film 32 may include a highly electronegative substance, besides the above metals and oxygen or nitrogen. A highly electronegative substance is a substance whose electronegativity is higher than the electronegativity of the above metals.

The film thickness of the variable resistance films 32 is preferably the same for all variable resistance films 32. Preferably the film thickness of the variable resistance films 32 is, for example, 1 to 20 nm, and for good processability of the pillar 16, preferably is not more than 10 nm, and for improved uniformity and reliability of the variable resistance film, preferably is not less than 2 nm.

On the other hand, the composition of the variable resistance films 32 is preferably uniform in both a film thickness direction and an in-plane direction within a single variable resistance film 32, but it is necessary that there be differences between variable resistance films 32. Namely, a concentration of the highly electronegative substance varies between variable resistance films 32.

For example, in the case that the metal is hafnium (Hf), preferably the highly electronegative substance is silicon (Si), for example. An electronegativity of hafnium is 1.3, and an electronegativity of silicon is 1.9. In this case, preferably the concentration of silicon in the variable resistance film 32 is not more than 30 atomic percent, and more preferably is 1 to 20 atomic percent.

Taking one specific example, the number N of variable resistance units 23 provided in one pillar 16 is four, and each variable resistance film 32 includes hafnium, oxygen, and silicon. Then the silicon concentration in the first variable resistance film 32 is 0 to 3 atomic percent, in the second variable resistance film 32 is 7 to 10 atomic percent, in the third variable resistance film 32 is 14 to 17 atomic percent, and in the fourth variable resistance film 32 is 21 to 24 atomic percent.

In other words, when an integer n from 1 to N is allocated to the N variable resistance films 32 provided in one pillar 16, a concentration $C(n)$ (atomic percent) of the highly electronegative substance in an nth variable resistance film 32 can be expressed by the following Formula 1, where a is a constant between 0 and 3 (atomic percent). However, the value of n is not related to the order of deposition of the variable resistance films 32.

$$C(n)=7\times(n-1)+a$$

The following is an explanation of the materials of the films other than the current selection film 22 and the variable resistance films 32.

There is no particular limitation on the material of the cathode film 31 and the anode film 33, provided it is a material whose resistivity is low, and for which the interface characteristics to obtain switching operation of the variable resistance film 32, close contact with the variable resistance film 32, and heat resistance can be obtained. However, in all variable resistance units 23, preferably the cathode films 31 are formed from the same material, and preferably the anode films 33 are formed from the same material.

For example, the material of the cathode film 31 and the anode film 33 can be, for example, one or more metals selected from the group consisting of nickel (Ni), titanium (Ti), zirconium (Zr), iron (Fe), vanadium (V), manganese (Mn), cobalt (Co), and hafnium (Hf), or oxides or nitrides thereof. Or, the material of the cathode film 31 and the anode film 33 may be $p^+$ type polysilicon or $n^+$ type polysilicon that includes an impurity. In order to obtain low resistivity and high tolerance to processing, titanium nitride (TiN) is preferred. Also, preferably the film thickness is 5 to 15 nm. In this case the barrier metal layer 21 can be omitted.

Or, $n^+$-type polysilicon may be used as the material of the cathode film 31, and titanium nitride may be used as the material of the anode film 33. As a result, the cathode film 31 becomes depleted during a set operation that is described later, and the current value suddenly increases immediately after the variable resistance film 32 has transitioned to the low resistance state, so self-adjusting control is possible. In this case, in order that the $n^+$-type polysilicon that forms the cathode film 31 exhibits low resistivity at times other than the set operation, and during the set operation the cathode film 31 becomes completely depleted, preferably the concentration of impurities is $1\times10^{19}$ to $1\times10^{20}$ cm$^{-3}$, and the film thickness is 5 to 15 nm.

Also, the material of the barrier metal layer 21 can be, for example, one or more metals selected from the group consisting of ruthenium (Ru), titanium (Ti), tantalum (Ta), tungsten (W), hafnium (Hf), and aluminum (Al), or oxides or nitrides thereof. In particular, titanium nitride (TiN) is preferable from the points of view of resistivity, the set operation of the variable resistance films 32, and tolerance to processing. Also, preferably the film thickness is 5 to 15 nm.

Next, a manufacturing method of the nonvolatile memory device according to the embodiment will be explained.

FIGS. 3 through 7 are process cross-sectional views illustrating the method for manufacturing the nonvolatile memory device according to the embodiment.

First, as illustrated in FIG. 1, a Metal-Oxide-Semiconductor Field-Effect Transistor (MOSFET) or the like is formed on the top face of the silicon substrate 11, and the drive circuit for driving the memory cells 13 is formed. Next, the inter-layer insulating film 12 is formed on the silicon substrate 11. Next, a contact (not illustrated on the drawings) that extends to the drive circuit is formed in the inter-layer insulating film 12.

Figure 3:
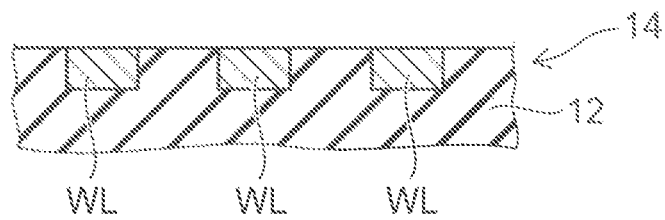
FIGS. 3 through 7 are process cross-sectional views illustrating a method for manufacturing the nonvolatile memory device according to the embodiment.

Next, as illustrated in FIG. 3, tungsten is embedded in a top layer portion of the inter-layer insulating film 12 using, for example, a damascene method, and a plurality of word lines WL are formed so as to extend parallel to each other in the word line direction. The word line interconnect layer 14 is formed by these word lines WL. Instead of the damascene method, the word lines WL may be formed by the reactive ion etching (RIE) method, and the surroundings embedded in the inter-layer insulating film 12.

Figure 4:
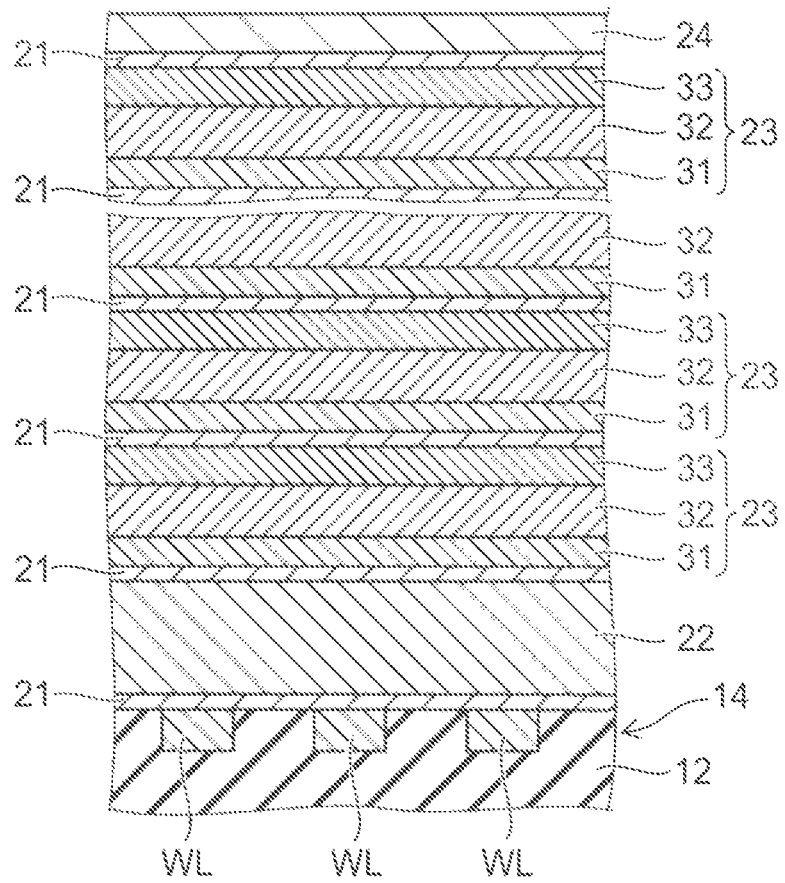

Next, as illustrated in FIG. 4, the barrier metal layer 21 is formed on the word line interconnect layer 14, and next the current selection film 22 is formed. The current selection film 22 is formed by, for example, forming the n-type layer 22n (see FIG. 2) by introducing impurities that will become donors while depositing the silicon, forming an i-type layer 22i (see FIG. 2) by depositing silicon without introducing impurities, and forming the p-type layer 22p (see FIG. 2) by introducing impurities that will become acceptors while depositing the silicon. Next, barrier metal layers 21 and variable resistance units 23 are formed alternately a plurality of times. When forming the variable resistance units 23, the cathode film 31, the variable resistance film 32, and the anode film 33 are deposited in that order. Then, the uppermost barrier metal layer 21 is formed, and the contact layer 24 is formed.

Figure 5:
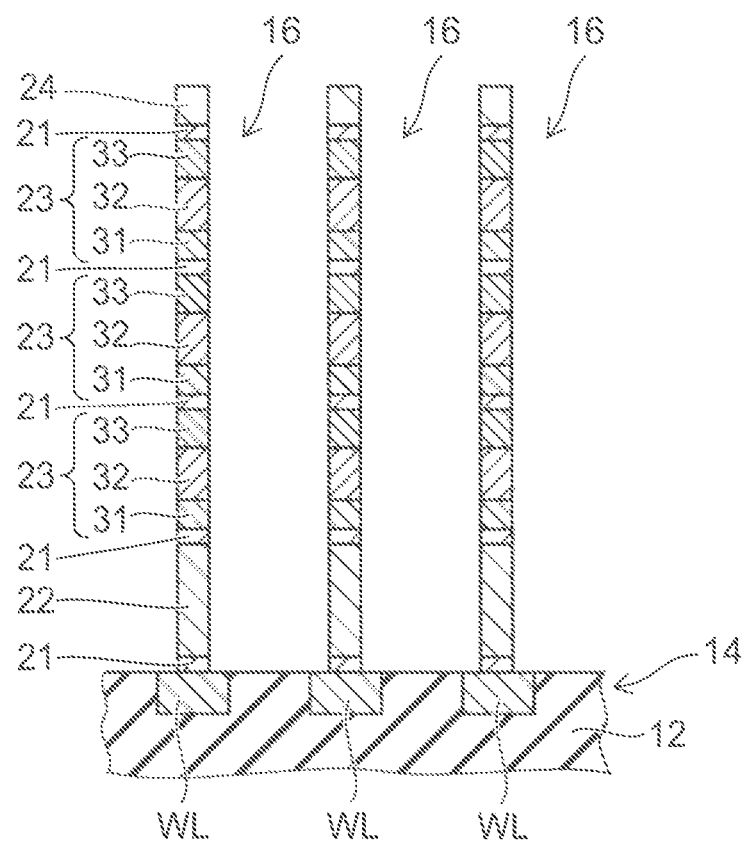

Next, as illustrated in FIG. 5, a mask pattern (not illustrated on the drawings) is formed by the lithography method, and reactive ion etching (RIE) is carried out using the mask pattern as a mask, the stacked films stacked on the word line interconnect layer 14 are processed, and segmentalized along the word line direction and the bit line direction. As a result, the plurality of pillars 16 is formed on the word line interconnect layer 14.

Figure 6:
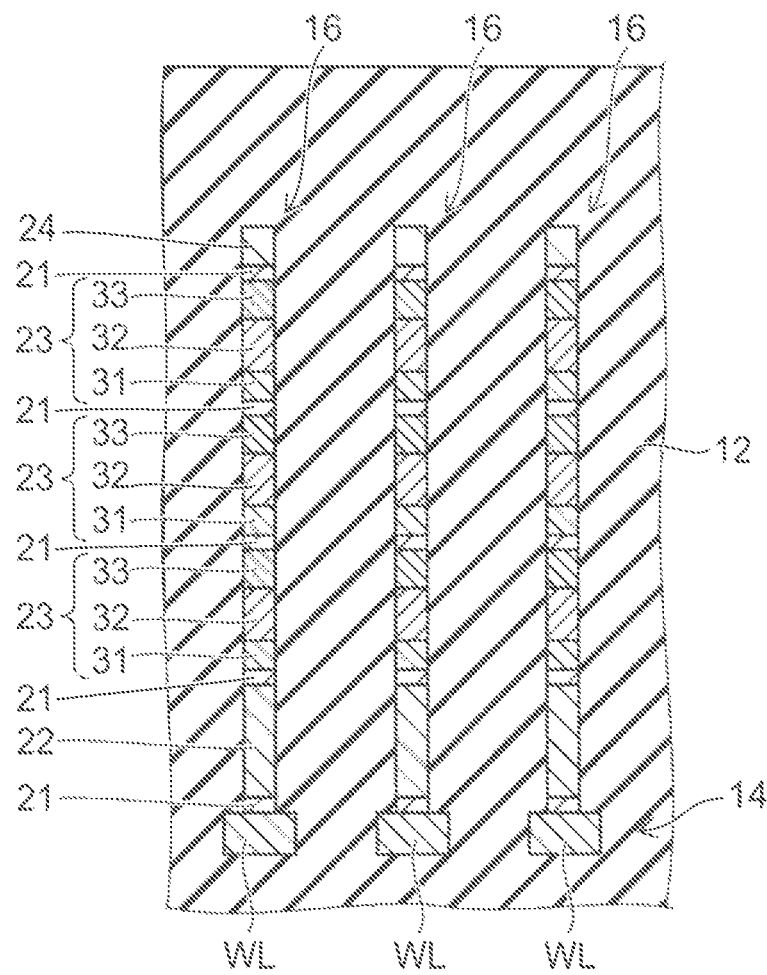

Next, as illustrated in FIG. 6, the inter-layer insulating film 12 is further formed on the word line interconnect layer 14, thereby embedding the pillars 16.

Figure 7:
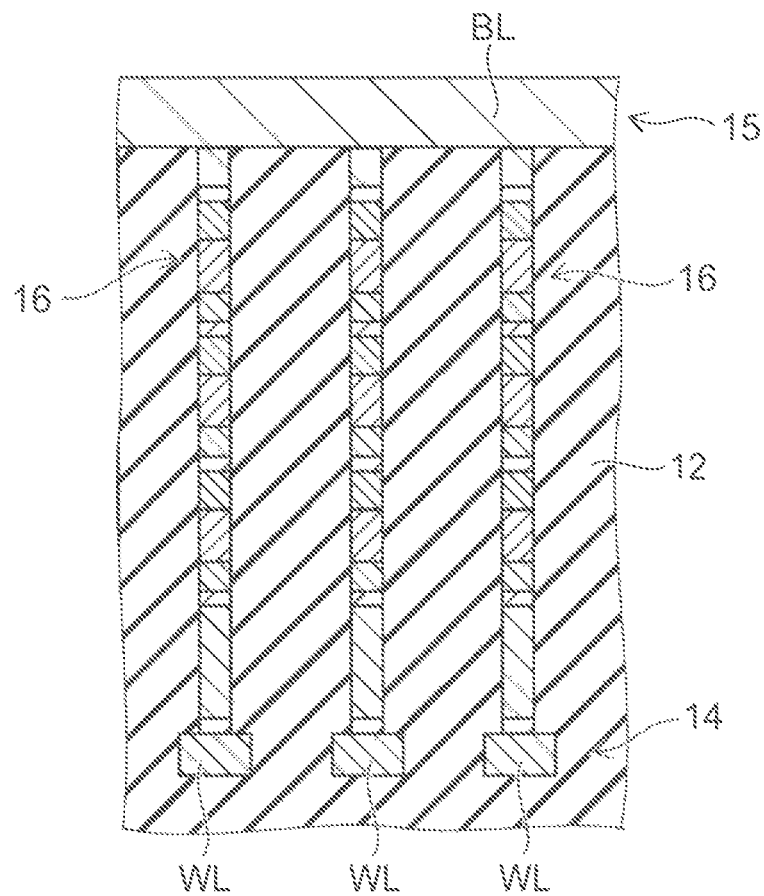

Next, as illustrated in FIG. 7, chemical mechanical polishing (CMP) is carried out to flatten the top face of the inter-layer insulating film 12, and the contact layer 24 is exposed. Next, the plurality of bit lines BL is formed on the inter-layer insulating film 12 extending in the bit line direction, by for example, the damascene method or the RIE method, and the bit line interconnect layer 15 is formed.

Next, as illustrated in FIG. 1, the plurality of pillars 16 is formed on the bit line interconnect layer 15. At this time, the order of forming each layer in the current selection film 22 is reversed relative to the process illustrated in FIG. 4, with the p-type layer 22p, the i-type layer 22i, and the n-type layer 22n being formed in that order. Also, the order of forming each film in the variable resistance unit 23 is reversed, with the anode film 33, the variable resistance film 32, and the cathode film 31 being deposited in that order. After forming the pillars in this manner, the pillars 16 are embedded in the inter-layer insulating film 12.

Thereafter, the word line interconnect layer 14, the pillars 16, the inter-layer insulating film 12, the bit line interconnect layer 15, the pillars 16, and the inter-layer insulating film 12 are repeatedly formed by the same method. As a result, the stacked cross-point cell array is manufactured. In this way, the nonvolatile memory device 1 according to the embodiment is manufactured.

Next, the operation of the nonvolatile memory device according to the embodiment will be explained.

Figure 8:
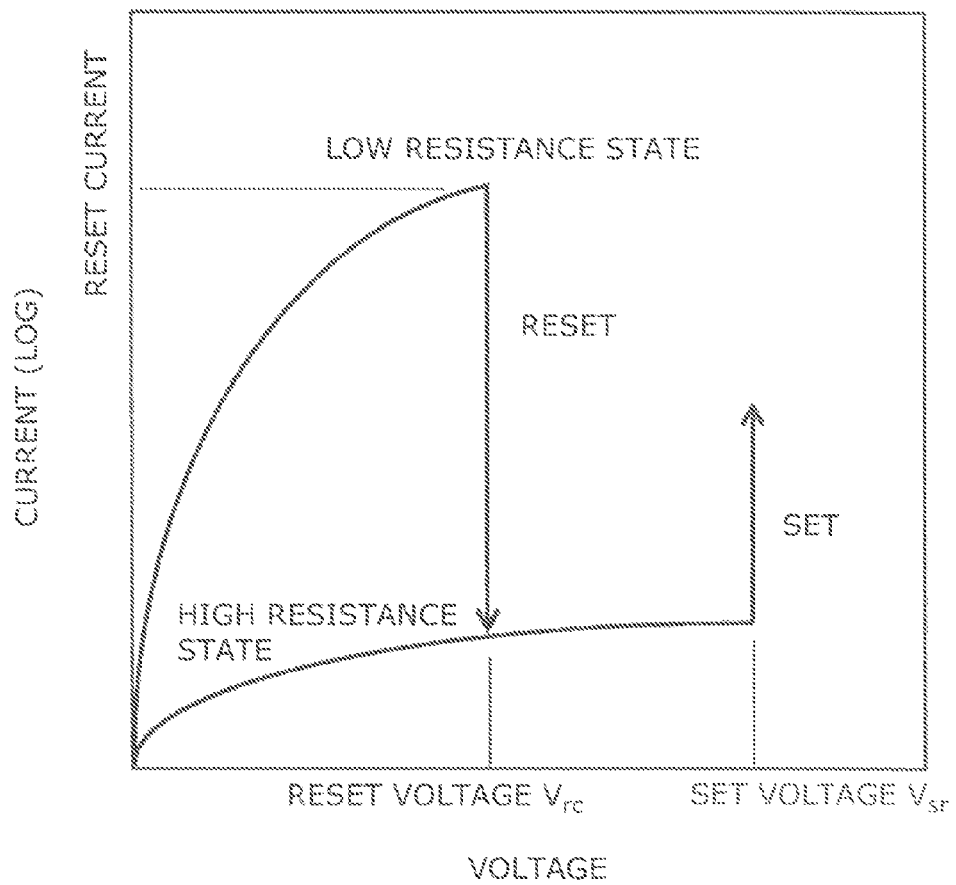
FIG. 8 is a graph illustrating the I-V characteristic of the variable resistance film.
Figure 9:
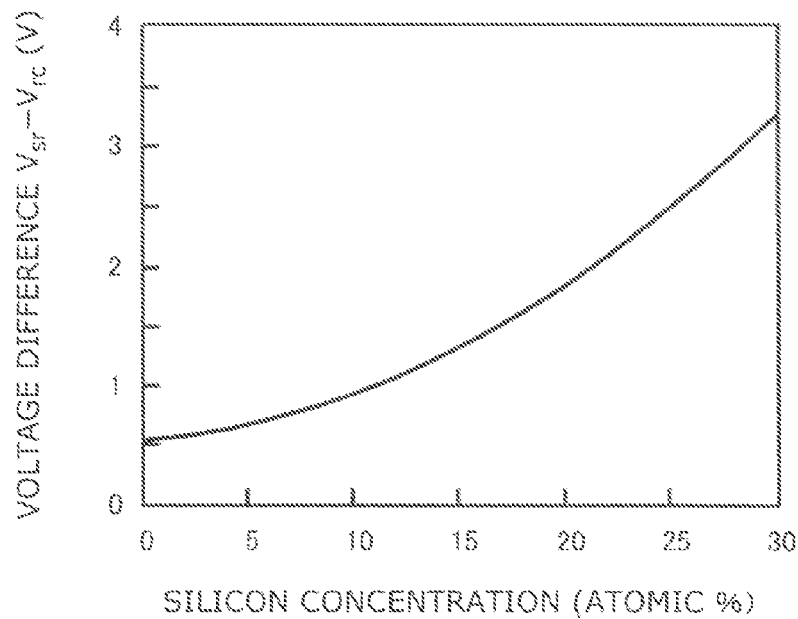
FIG. 9 is a graph illustrating the effect of the concentration of highly electronegative substance on the set voltage.
Figure 10:
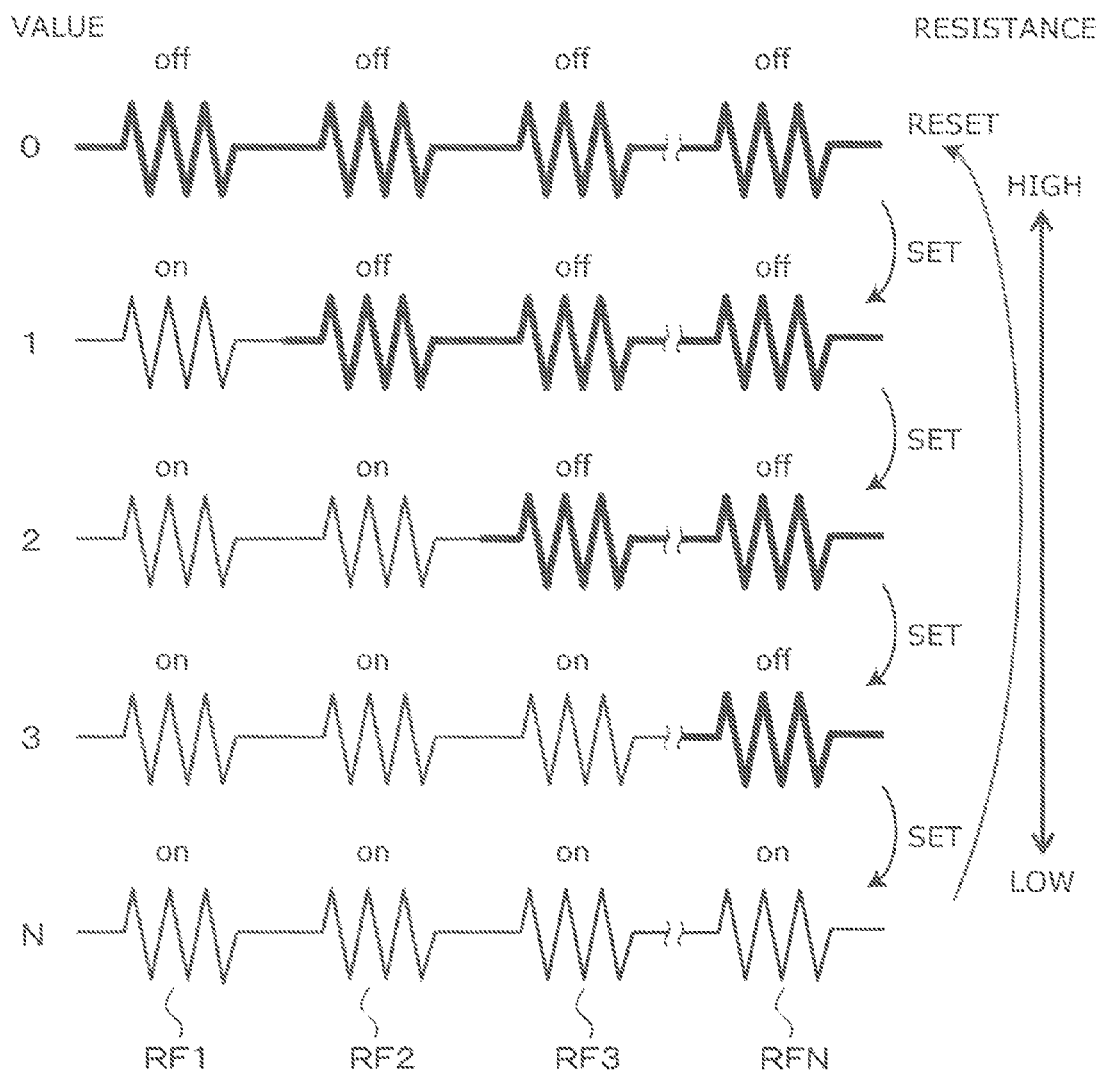
FIG. 10 illustrates the resistance state that can be obtained in the pillars in the nonvolatile memory device according to the embodiment.
Figure 11:
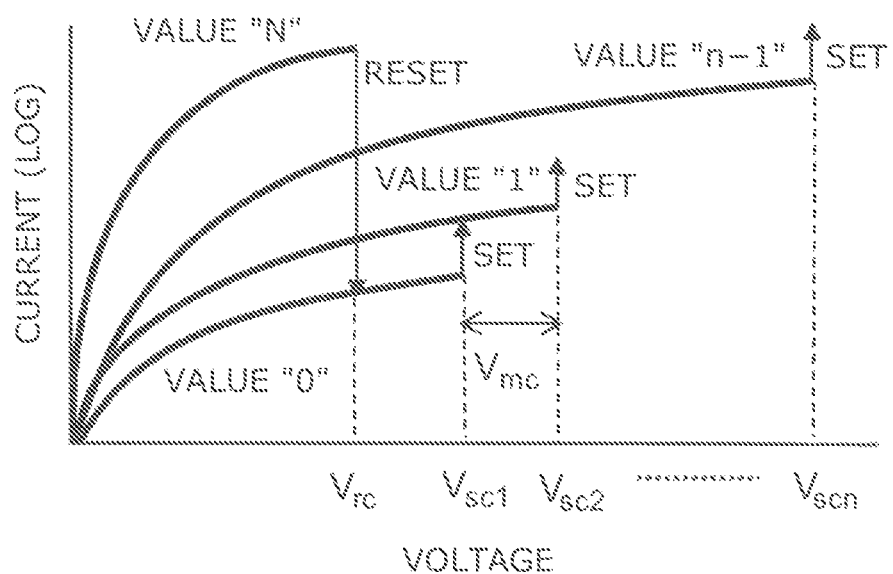
FIG. 11 is a graph illustrating the I-V characteristic of the overall pillar, with voltage on the horizontal axis, and current on the vertical axis.
Figure 12:
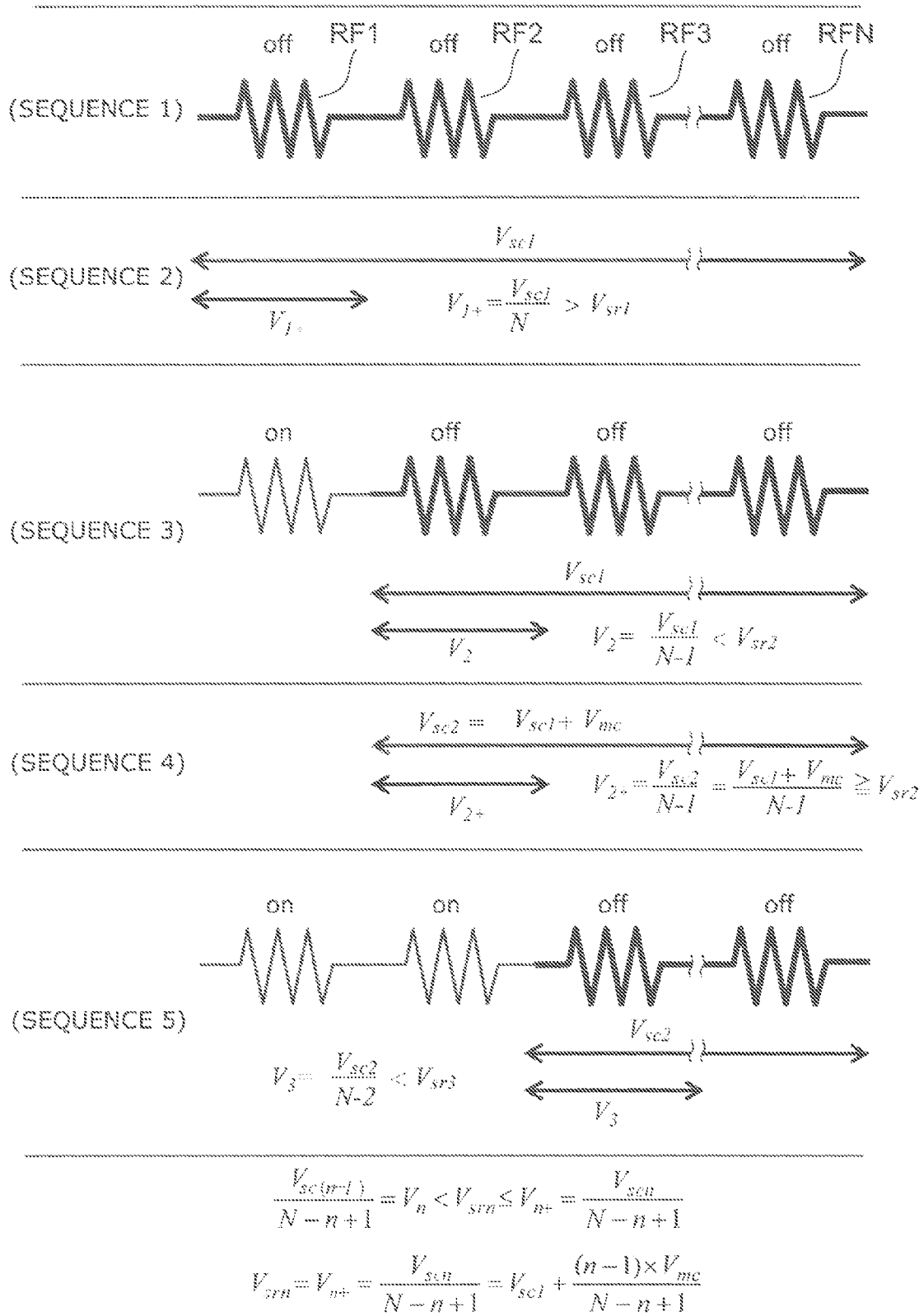
FIG. 12 illustrates the voltages applied to each variable resistance film at each stage of operation.
Figure 13:
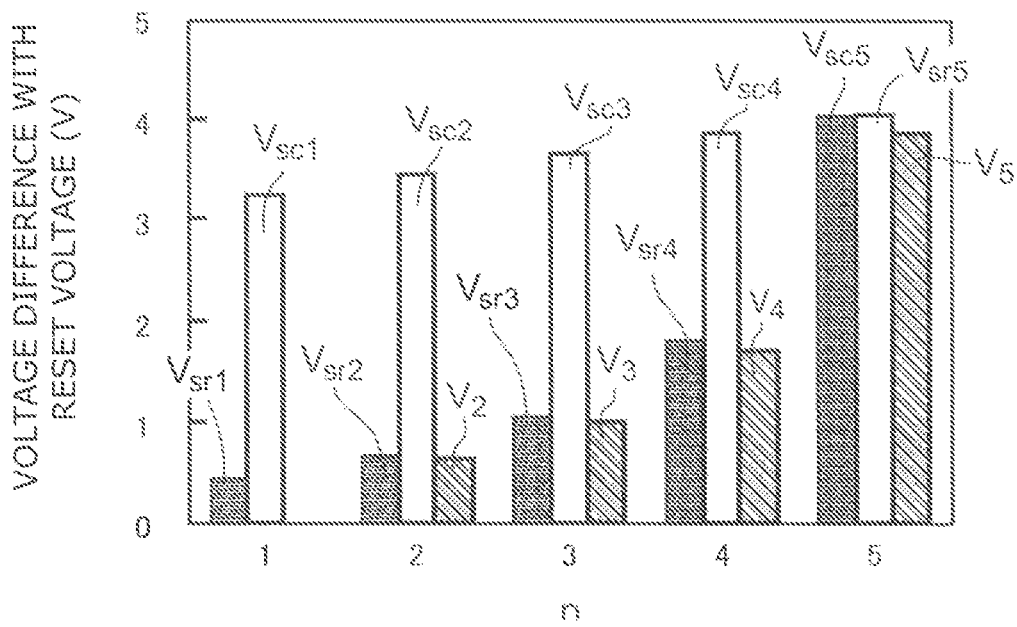
FIG. 13 is a graph illustrating the difference between each voltage and the reset voltage.
Figure 14:
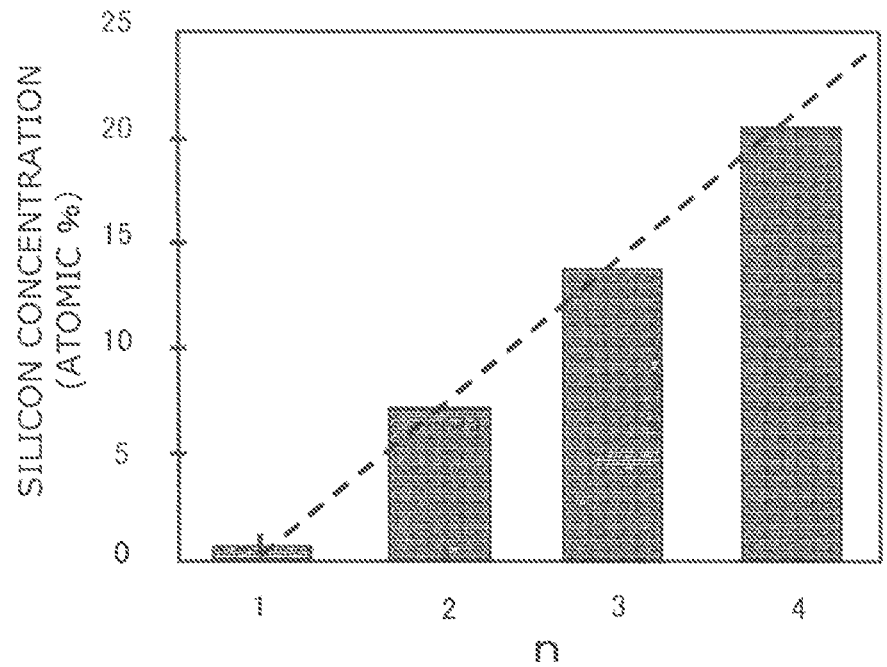
FIG. 14 is a graph illustrating the relationship between the number of stacked layers of variable resistance film and the necessary silicon concentration.

FIG. 8 is a graph illustrating the I-V characteristic of the variable resistance film, with voltage on the horizontal axis, and current on the vertical axis, FIG. 9 is a graph illustrating the effect of the concentration of highly electronegative substance on the set voltage, with silicon concentration in the variable resistance film having hafnium oxide as the main component on the horizontal axis, and the difference between the set voltage and the reset voltage on the vertical axis, FIG. 10 illustrates the resistance state that can be obtained in the pillars in the nonvolatile memory device according to the embodiment, FIG. 11 is a graph illustrating the I-V characteristic of the overall pillar, with voltage on the horizontal axis, and current on the vertical axis, FIG. 12 illustrates the voltages applied to each variable resistance film at each stage of operation, FIG. 13 is a graph illustrating the difference between each voltage and the reset voltage, with the variable resistance film on the horizontal axis and voltage on the vertical axis, and FIG. 14 is a graph illustrating the relationship between the number of stacked layers of variable resistance film and the necessary silicon concentration, with the variable resistance film on the horizontal axis, and the silicon concentration in the variable resistance film that has hafnium oxide as main component on the vertical axis.

First, the operation of the variable resistance film is explained.

As shown in FIG. 8, when a voltage is applied in the film thickness direction to a variable resistance film in the "high resistance state," when a certain voltage is reached, the resistance state transitions from the "high resistance state" to the "low resistance state." This operation is referred to as the "set operation," and the voltage at this time is referred to as the "set voltage." On the other hand, when a voltage is applied in the film thickness direction to a variable resistance film in the "low resistance state," the current flowing through the variable resistance film increases as the voltage increases, and when a certain current is reached, the resistance state transitions from the "low resistance state" to the "high resistance state." This operation is referred to as the "reset operation," and the current at this time is referred to as the "reset current" and the voltage is referred to as the "reset voltage." Normally the reset voltage is lower than the set voltage.

The mechanism by which the variable resistance film that is made from a metal oxide or a metal nitride exhibits this type of behavior is not yet clear, but one model is as follows, for example. Namely, when there is a part with a deficit of oxygen or nitrogen in a metal oxide, that part becomes metal-rich, and the electrical conductivity thereof increases. If such metal-rich parts become linked from a top face to a bottom face of the variable resistance film, a current path will be formed in the thickness direction, and the resistance value of the variable resistance film as a whole will be reduced. This state is the "low resistance state," and this type of current path is referred to as a "filament."

When a fixed amount of current flows through the variable resistance film 32 in the "low resistance state," some of the filaments become locally heated, perhaps where the filaments contact the cathode film 31 or the anode film 33, and the deficit of oxygen or nitrogen is remedied. As a result, those parts return to being insulators, so the filaments are disconnected, and the resistance of the variable resistance film as a whole increases. This operation is the "reset operation," and the state after the increase in the resistance value is the "high resistance state."

On the other hand, when a fixed voltage is applied to the variable resistance film 32 in the "high resistance state" with the filaments disconnected, a high voltage is applied to the disconnected parts of the filaments, and oxygen atoms or nitrogen atoms are expelled from those parts. As a result, there is a deficit of oxygen or nitrogen formed at these parts, so the filaments become connected. As a result, the resistance value of the variable resistance film as a whole is reduced, and is in the "low resistance state." This operation is referred to as the "set" operation.

Then, as shown in FIG. 9, according to the investigations carried out by the inventors and others, when a substance (highly electronegative substance) with electronegativity higher than of the metal that constitutes the metal oxide or the metal nitride is added to the variable resistance film that is made from the metal oxide or metal nitride, the set voltage is increased. The set voltage becomes high, so that the concentration of highly electronegative substance is high. On the other hand, the reset voltage is virtually independent of the concentration of the highly electronegative substance. Therefore, the difference between the set voltage and the reset voltage becomes greater, so that the concentration of highly electronegative substance is high. Therefore it is possible to control the set voltage of the variable resistance film by including the highly electronegative substance in the variable resistance film in this manner. FIG. 9 shows a case in which the main component of the variable resistance film is hafnium oxide, and silicon is added as the highly electronegative substance.

The mechanism of this phenomenon is not clear, but for example it is inferred to be as follows. Namely, by adding the highly electronegative substance to the metal oxide it becomes difficult to lose oxygen from the metal oxide. Likewise, by adding the highly electronegative substance to the metal nitride it becomes difficult to lose nitrogen from the metal nitride. In other words, the highly electronegative substance does not contribute to the formation of filaments, so by increasing the concentration of highly electronegative substance, higher energy is necessary to form filaments, and the set operation as described above becomes difficult to perform. As a result, the set voltage increases.

However, if the concentration of highly electronegative substance becomes too high, and more than half of the atoms adjacent to the metal atoms that constitute the metal oxide or metal nitride are atoms of the highly electronegative substance, the formation of filaments that penetrate through the variable resistance film becomes difficult, and the set operation itself is difficult to occur. For example, in an example in which silicon is added to hafnium oxide as described above, if the silicon concentration exceeds 30 atomic percent, the electrical characteristics of the variable resistance film approach the electrical characteristics of silicon oxide ($SiO_2$), so it becomes simply an insulating film. As a result, there is an upper limit to the concentration of the highly electronegative substance, and in the example of adding silicon to hafnium oxide, the value of the upper limit is about 30 atomic percent.

On the other hand, after a filament has once formed, the value of the resistance of the variable resistance film is virtually independent of the concentration of the highly electronegative substance, so the reset voltage is also virtually independent of the concentration of the highly electronegative substance. Therefore, as the concentration of highly electronegative substance increases, the difference between the set voltage and the reset voltage also increases.

Next, the operation of a pillar 16, in other words the operation of one memory cell, is explained.

As illustrated in FIGS. 2 through 10, in each pillar 16, the plurality of variable resistance films is connected in series. Also, the set voltage of each variable resistance film is different from the others. In FIG. 10, the "low resistance state" is indicated as "on," and the "high resistance state" is indicated as "off." Also, the variable resistance films are represented by a resistance symbol, and the resistance symbols are indicated as RF1, RF2, RF3, . . . , RFN in the order of lower set voltage. The same applies to FIG. 12 which is described later.

As illustrated in FIG. 10, a pillar provided with N variable resistance films can have (N+1) resistance states as indicated below. In the following explanation, suitable values are allocated to the resistance states of the pillars for explanation, but it is arbitrary what values are allocated to the resistance states.

(State 1) The state 1 is the state in which all variable resistance films are in the "high resistance state." The value is "0." At this time the resistance value of the pillar 16 as a whole is highest.

(State 2) The state 2 is the state in which the variable resistance film RF1 with the lowest set voltage is in the "low resistance state," and the remainder of the variable resistance films are in the "high resistance state." The value is "1."

(State 3) The state 3 is the state in which the variable resistance film RF1 with the lowest set voltage and the variable resistance film RF2 with the second lowest set voltage are in the "low resistance state," and the remainder of the variable resistance films are in the "high resistance state." The value is "2."

...

(State (n+1)) The state (n+1) is the state in which the n variable resistance films with the lowest set voltages are in the "low resistance state," and the remainder of the variable resistance films are in the "high resistance state." The value is "n."

...

(State (N+1)) The state (N+1) is the state in which the state in which all variable resistance films are in the "low resistance state." The value is "N." At this time the value of the resistance of the pillar 16 as a whole is lowest.

Next, the method of switching the resistance state of the pillar is explained.

As illustrated in FIGS. 10 and 11, in the state where all the variable resistance films are in the "high resistance state" (value "0"), if the voltage Vsc1 is applied to the pillar, the variable resistance film RF1 with the lowest set voltage is set. At this time, the remainder of the variable resistance films stay in the "high resistance state." In this way the value becomes "1." Next, if a voltage Vsc2 that is higher than the voltage Vsc1 is applied to the pillar, the variable resistance film RF2 with the second lowest set voltage is set. In this way the variable resistance films RF1 and RF2 are in the "low resistance state," and the value is "2."

Thereafter the variable resistance films are set one at a time in the order from the lowest set voltage. As long as there is at least one variable resistance film in the "high resistance state," the current flowing in the pillar is small, and does not reach the "reset current." When all the variable resistance films are in the "low resistance state", the value becomes "N." At this time, the pillar overall becomes conducting due to the electrodes and the filaments, so the resistance value of the pillar overall becomes low. Then, after all the variable resistance films are in the "low resistance state," if the reset voltage $V_{rc}$ is applied to the pillar, the reset current flows, and all the variable resistance films are reset. In this way, the value returns to "0." As a result of this type of operation, it is possible to switch the resistance state of the pillar by varying the resistance value of the variable resistance films in a self-adjusting manner. At this time the resistance value of the pillar as a whole varies in stages. In this way, it is possible to store values in (N+1) levels in each memory cell.

Next, the relationship between the voltage necessary for each operation described above and the set voltage for each variable resistance film is explained.

The fundamental considerations regarding voltage setting are as follows. As described above, the variable resistance films connected in series are set one at a time. At that time, when a certain variable resistance film is set, the voltage applied to each of the variable resistance films remaining at that time increases. It is necessary that the set voltage of the remaining variable resistance films be set to values so that they will not set due to that voltage. If this is not done then as soon as the first variable resistance film is set, the remaining variable resistance films will set in a chain reaction. In other words, it is necessary that the voltage applied to the pillar is a voltage that causes only one variable resistance film of the variable resistance films in the "high resistance state" to set, and does not cause the remaining variable resistance films to set.

The following is a quantitative explanation. In the following explanation, in order to simplify the explanation, it is assumed that the resistance value of the variable resistance films in the "low resistance state" is zero. Also, it is assumed that the resistance values of the variable resistance films in the "high resistance state" are all the same. In addition, the resistance values of members other than the resistance value of the variable resistance films are ignored.

In the following explanation, each voltage is defined as follows.

$V_{srn}$: The set voltage of the variable resistance film RFn with the nth lowest set voltage $V_n$: The voltage applied to each of the variable resistance films in the high resistance state immediately after (n−1) variable resistance films RF1 to RF(n−1) have been set $V_{scn}$: The voltage applied to the pillar to set the variable resistance film RFn $V_{n+}$: The voltage applied to each of the variable resistance films in the high resistance state when setting the variable resistance film RFn $V_{mc}$: Margin voltage defined by $V_{scn}-V_{sc(n-1)}$ In FIG. 12, as indicated by (Sequence 1), in the initial state all variable resistance films RF1 through RFN are in the "high resistance state."

In this state, as indicated by (Sequence 2), in order to set the variable resistance film RF1 with the lowest set voltage, the voltage $V_{sc1}$ is applied to the pillar. At this time, the voltage $V_{1+}$ applied to each variable resistance film is ($V_{sc1}/N$). It is necessary to set the variable resistance film RF1 with this voltage, so the set voltage for the variable resistance film RF1, $V_{sr1}$ is, $V_{sr1} \leq V_{1+} = V_{sc1}/N$.

In this way, as indicated in (Sequence 3), the variable resistance film RF1 is set, and is in the "low resistance state." As a result, the voltage $V_{sc1}$ that was shared by the N variable resistance films until just prior to this, is now shared by (N−1) variable resistance films. Therefore, the voltage applied to each variable resistance film $V_2$ is, $\{V_{sc1}/(N-1)\}$. At this time, in order that the variable resistance film RF2 with the second lowest set voltage does not set, it is necessary that the set voltage $V_{sr2}$ of the variable resistance film RF2 be set higher than the voltage $V_2$. In other words, $V_2 < V_{sr2}$. For example, if the margin voltage of the pillar as a whole is $V_{mc}$, then $V_{sr2} = (V_{sc1}+V_{mc})/(N-1) > V_2 = V_{sc1}/(N-1)$.

Then, as indicated by (Sequence 4), in order to set the variable resistance film RF2 with the second lowest set voltage, the voltage $V_{sc2}$ is applied to the pillar in the state in (Sequence 3). $V_{sc2} = V_{sc1}+V_{mc}$. At this time, the voltage $V_{2+}$ applied to each variable resistance film is $\{V_{sc2}/(N-1)\}$. It is necessary that the variable resistance film RF2 be set by this voltage, so it is necessary that the set voltage $V_{sr2}$ of the variable resistance film RF2 be $V_{sr2} \leq V_{2+} = V_{sc2}/(N-1) = (V_{sc1}+V_{mc})/(N-1)$.

In this way, as indicated in (Sequence 5), the variable resistance film RF2 is set, and is in the "low resistance state." As a result, the voltage $V_{sc2}$ that was shared by the (N−1) variable resistance films until just prior to this, is now shared by (N−2) variable resistance films. Therefore, the voltage applied to each variable resistance film $V_3$ is $\{V_{sc2}/(N-2)\}$. At this time, in order that the variable resistance film RF3 with the third lowest set voltage does not set, it is necessary that the set voltage $V_{sr3}$ of the variable resistance film RF3 be set higher than the voltage $V_3$. In other words, $V_3 < V_{sr3}$. For example, taking the margin voltage $V_{mc}$ into consideration as described above, $V_{sr3} = (V_{SC2} \pm V_{mc})/(N-2) = (V_{sc1} + 2V_{mc})/(N-2) > V_3 = V_{sc2}/(N-2)$.

The same applies thereafter. In other words, immediately after setting the variable resistance film RF(n−1) with the (n−1)th lowest set voltage, the voltage $V_{sc(n-1)}$ is applied to the pillar as a whole. At this time, the (n−1) variable resistance films RF1 through RF(n−1) are in the "low resistance state," and (N−n+1) variable resistance films RFn through RFN are in the "high resistance state." Therefore, the voltage $V_n = V_{sc(n-1)}/(N-n+1)$ is applied to each variable resistance film in the "high resistance state." It is necessary that the variable resistance film RFn does not set with the voltage $V_n$, so it is necessary that the set voltage $V_{sm}$ of the variable resistance film RFn be $V_{sm} > V_n$.

On the other hand, to set the variable resistance film RFn with the nth lowest set voltage, the voltage $V_{scn}$ is applied to the pillar as a whole, so the voltage applied to each of the variable resistance films in the high resistance state $V_{n+}$ is, $V_{n+} = V_{scn}/(N-n+1)$. It is necessary that the variable resistance film RFn sets with the voltage $V_{n+}$, so it is necessary that the voltage $V_{sm}$ of the variable resistance film RFn is given by, $V_{sm} \le V_{n+}$.

From the above, the set voltage $V_{sm}$ of the variable resistance film RFn is set to satisfy the following Formula 2.

$$\frac{V_{sc(n-1)}}{N-n+1} = V_n < V_{sm} \le V_{n+} = \frac{V_{scn}}{N-n+1}.$$

For example, taking the margin voltage $V_{mc}$ as described above into consideration, $V_{scn} = V_{sc(n-1)} + V_{mc}$. In this way, $V_{scn} = V_{sc1} + (n-1)V_{mc}$. When the set voltage $V_{sm}$ of the variable resistance film RFn is given by $V_{sm} = V_{n+}$, the following Formula 3 is obtained. The set voltage $V_{sm}$ is set in accordance with the following Formula 3.

$$V_{sm} = V_{n+} = \frac{V_{scn}}{N-n+1} = V_{sc1} + \frac{(n-1) \times V_{mc}}{N-n+1}.$$

When the set voltage $V_{sm}$ of each variable resistance film RFn and the voltage $V_{scn}$ applied to the pillar are set in accordance with the above Formula 3, the voltages as shown in FIG. 13 are obtained, for example. FIG. 13 shows the differences between each voltage and the reset voltage. In the example shown in FIG. 13, assuming the reset voltage $V_{rc}$ is 0.25 V, the voltage $V_{sc1}$ is 3.5 V, and the margin voltage $V_{ms}$ is 0.2 V.

As shown in FIG. 13, as the number of layers of variable resistance films increases, the required set voltage rapidly increases. In order to realize this set voltage, the content of highly electronegative substance may be increased the higher the set voltage of the variable resistance film, as shown in FIG. 14. Also, to ensure the margin voltage $V_{mc}$, preferably the difference in silicon concentration between variable resistance films is constant. The silicon concentration of each variable resistance film shown in FIG. 14 satisfies the relationship expressed by Formula 1 above.

As shown in FIG. 14, when the main component of the variable resistance films is hafnium oxide and the highly electronegative substance is silicon, when the number of layers of variable resistance film N is not more than 4, it is possible to achieve variable resistance films that satisfy the above Formula 2 and Formula 3 without difficulty. In other words, in order to ensure controllability of the composition of each variable resistance film, to keep the device driving voltage, in other words the voltage $V_{scN}$ applied to the pillar as a whole, within a practical range, and to keep the aspect ratio of the pillar low, preferably the number of layers N of variable resistance film is not more than 4. On the other hand, in order to achieve multi-value operation, preferably the number of layers N is not less than 2.

On the other hand, as shown in FIG. 13, when the number of layers N of variable resistance films is not less than 5, it is necessary that the difference between the set voltage and the reset voltage be not less than 4 V, and therefore it is necessary that the concentration of silicon in the variable resistance films be not less than 30 atomic percent. However, as stated above, in a variable resistance film with hafnium oxide as the main component, if the silicon concentration is greater than 30 atomic percent, the switching probability of the variable resistance film is greatly reduced.

However, the examples shown in FIGS. 13 and 14 are examples of the combination of hafnium oxide and silicon. If there was a combination of materials for which it was possible to obtain a greater variation in the set voltage by adding less highly electronegative substance, it would be possible to achieve a greater number of layers. Also, the greater the number of layers, the greater the level of values that can be stored in each memory cell, so the storage capacity of the nonvolatile memory device is increased.

Next, the operation of the nonvolatile memory device 1 will be explained.

The drive circuit selects one word line WL from among the word lines WL that belong to the word line interconnect layer 14, and applies a relatively low voltage. Also, the drive circuit selects one bit line BL from among the bit lines BL that belong to the bit line interconnect layer 15, and applies a relatively high voltage. In this way, a voltage in the forward direction is applied to the pillar that is connected between the selected word line WL and the selected bit line BL.

At this time, a relatively high voltage is applied to the word lines WL that were not selected, and a relatively low voltage is applied to the bit lines BL that were not selected. Therefore, a voltage in the reverse direction is applied to the pillars 16 connected between the word lines WL that were not selected and the bit lines BL that were not selected, but in this case the silicon diode formed in the current selection film 22 is connected in reverse, so no voltage is applied to the variable resistance films 32 provided within these pillars 16. In this way, a voltage is applied only to the variable resistance films 32 that belong to the selected pillar 16.

Then, the above operation is executed and multi-value data is read in, by applying a specific voltage to the selected pillar 16. Also, by measuring the resistance value of this pillar 16, the multi-value data that is written into this pillar 16 is read. In this way, in the nonvolatile memory device 1, it is possible to store multi-value data in each pillar 16.

Next, the effect of the embodiment will be explained.

In the nonvolatile memory device according to the embodiment, a plurality of variable resistance units 23 is provided in each pillar 16, and variable resistance films 32 are provided in each variable resistance unit 23. In this way, it is possible to store multi-value data in each pillar 16 by the operation described above, and it is possible to increase the storage capacity without increasing the number of layers in the memory cells. As a result, it is possible to reduce the wafer area per bit, and it is possible to reduce the manufacturing cost per bit.

Also, in the embodiment, by setting the set voltage of each variable resistance film and the voltage applied to the pillars as described above, the plurality of variable resistance films that belongs to each pillar is set sequentially, and reset at once, so it is possible to allow multi-value operation of each memory cell in a self-adjusting manner. In this way, it is not necessary to provide a control transistor to control the current and voltage of each memory cell, and it is possible to achieve a 3-dimensional cross-point structure for the structure of the nonvolatile memory device 1. As a result, it is possible to achieve large scale integration and increase the capacity of the memory cells.

According to the embodiments as described above, it is possible to realize a nonvolatile memory device that is capable of increasing the storage capacity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device, comprising:
a word line interconnect layer including a plurality of word lines extending in a first direction;
a bit line interconnect layer including a plurality of bit lines extending in a second direction that intersects the first direction;
a pillar disposed between each of the word lines and each of the bit lines,
the pillar including:
a current selection film; and
a plurality of variable resistance films stacked on the current selection film, one of the variable resistance films including a metal and either oxygen or nitrogen,
a remainder of the variable resistance films including the metal, either oxygen or nitrogen, and a highly electronegative substance having an electronegativity higher than an electronegativity of the metal, and
a concentration of the highly electronegative substance in the remainder of the variable resistance films being different among the variable resistance films.

2. The device according to claim 1, wherein the metal is one or more metals selected from the group consisting of hafnium, nickel, titanium, zirconium, iron, vanadium, manganese, cobalt, and aluminum.

3. The device according to claim 2, wherein the variable resistance films include oxygen, the metal is hafnium, and the highly electronegative substance is silicon.

4. The device according to claim 3, wherein the concentration of the highly electronegative substance in the variable resistance films is not more than 30 atomic percent.

5. The device according to claim 3, wherein when the number of layers of variable resistance films is N (N is an integer that is not less than 2), a is a constant from 0 to 3 (atomic percent), and an integer n from 1 to N is allocated to each of the N variable resistance films, the concentration C(n) (atomic percent) of the highly electronegative substance in each of the variable resistance films is expressed by the following formula:

$$C(n)=7\times(n-1)+a.$$

6. The device according to claim 3, wherein the number of layers of the variable resistance films is from 2 to 4.

7. The device according to claim 1, wherein when the number of layers of the variable resistance films is N (N is an integer that is not less than 2) and, of the N variable resistance films, a voltage applied to the pillar when setting one of the variable resistance films which has a lowest set voltage is $V_{sc1}$, a voltage applied to the pillar when setting one of the variable resistance films which has an nth (n is an integer from 1 to N) lowest set voltage is $V_{scn}$, a margin voltage is $V_{mc}$, and a set voltage of one of the variable resistance films with the nth lowest set voltage is $V_{sm}$, the set voltage $V_{sm}$ is set in accordance with the following formula:

$$V_{sm} = V_{sc1} + \frac{(n-1)\times V_{mc}}{N-n+1}.$$

8. The device according to claim 1, wherein when the number of layers of the variable resistance films is N (N is an integer that is not less than 2) and, of the N variable resistance films, a voltage applied to the pillar when setting one of the variable resistance films which has an nth (n is an integer from 1 through N) lowest set voltage is $V_{scn}$, and a set voltage of one of the variable resistance films with a nth lowest set voltage is $V_{srn}$, a set voltage $V_{sm}$, is set to satisfy the following formula:

$$\frac{V_{sc(n-1)}}{N-n+1} < V_{sm} \le \frac{V_{scn}}{N-n+1}.$$

9. The device according to claim 1, further comprising:
anode films connected to anode sides of the variable resistance films respectively; and
cathode films connected to cathode sides of the variable resistance films respectively,
the anode films being made from one material, and
the cathode films being made from another material.

* * * * *